(12) United States Patent
Imai et al.

(10) Patent No.: US 9,352,958 B2
(45) Date of Patent: May 31, 2016

(54) PHYSICAL QUANTITY MEASUREMENT SENSOR

(71) Applicant: NAGANO KEIKI CO., LTD., Tokyo (JP)

(72) Inventors: Atsushi Imai, Tokyo (JP); Ryouichi Matsumura, Tokyo (JP)

(73) Assignee: NAGANO KEIKI CO., LTD., Tokyo (JP)

( * ) Notice: Subject to any disclaimer, the term of this patent is extended or adjusted under 35 U.S.C. 154(b) by 0 days.

(21) Appl. No.: 14/540,632

(22) Filed: Nov. 13, 2014

(65) Prior Publication Data

US 2015/0137281 A1    May 21, 2015

(30) Foreign Application Priority Data

Nov. 15, 2013  (JP) ................................. 2013-237398

(51) Int. Cl.
*H01L 29/84*     (2006.01)
*B81B 7/00*      (2006.01)
(Continued)

(52) U.S. Cl.
CPC ............ *B81B 7/0051* (2013.01); *G01L 19/0084* (2013.01); *G01L 19/143* (2013.01); *G01L 19/147* (2013.01); *B81B 2201/0264* (2013.01); *H01H 59/0009* (2013.01); *H01L 29/0665* (2013.01); *H01L 29/0673* (2013.01); *H01L 29/84* (2013.01)

(58) Field of Classification Search
CPC ............ H01H 59/0009; H01L 29/0665; H01L 29/0673; H01L 29/84; H01L 21/00; G01L 19/147; G01L 19/143; G01L 19/0084; B81B 2201/0264

USPC .......... 257/415, 414, 417, E29.336, E33.046, 257/703, 704; 438/50, 51, 52, 418
See application file for complete search history.

(56) References Cited

U.S. PATENT DOCUMENTS 6,439,058 B1 * 8/2002 Aratani ................. G01L 19/003
                                                    73/754
7,152,483 B2 * 12/2006 Mast .................... G01L 19/0084
                                                    73/754
(Continued)

FOREIGN PATENT DOCUMENTS

DE   102008028978   12/2009
EP        1052489   11/2000
(Continued)

OTHER PUBLICATIONS

European Search Report dated Apr. 1, 2015 and received on Jul. 3, 2015, 7 pages.
(Continued)

*Primary Examiner* — Thinh T Nguyen
(74) *Attorney, Agent, or Firm* — Rankin, Hill & Clark LLP (57) ABSTRACT

A physical quantity measurement sensor includes: a ceramic package including a plate provided with a flow port through which a fluid to be measured flows; an electronic component including a sensing element housed in the package to detect the pressure of the fluid to be measured having flown through the flow port; a terminal provided on an exterior of the package; a lid attached to a wall of the package; and a metal attachment piece used to attach the package to the mount member, the attachment piece being engaged with the mount member while holding the package.

8 Claims, 6 Drawing Sheets

(51) Int. Cl.
  *G01L 19/00* (2006.01)
  *G01L 19/14* (2006.01)
  *H01L 29/06* (2006.01)
  *H01H 59/00* (2006.01)

(56) References Cited

U.S. PATENT DOCUMENTS

| | | | | |
|---|---|---|---|---|
| 7,216,547 B1* | 5/2007 | Stewart | ............... | G01L 9/0055 257/415 |
| 8,643,127 B2* | 2/2014 | Dangtran | ............. | B81B 7/0077 257/415 |
| 2009/0314096 A1* | 12/2009 | Colombo | ............. | G01L 19/147 73/754 |
| 2010/0044809 A1* | 2/2010 | Dangtran | ............. | B81B 7/0077 257/415 |
| 2013/0130424 A1* | 5/2013 | Horton | ............... | G01L 9/0055 438/50 |

FOREIGN PATENT DOCUMENTS

| | | |
|---|---|---|
| EP | 2136193 | 12/2009 |
| JP | 01-30401 | 2/1989 |
| JP | 09-148499 | 6/1997 |
| JP | 11-211600 | 8/1999 |
| JP | 2001-24032 | 9/2001 |
| JP | 2003-309205 | 10/2003 |
| JP | 2004-264243 | 9/2004 |
| JP | 2006-208087 | 8/2006 |
| JP | 2013-181788 | 9/2013 |
| WO | 2013/118843 | 8/2013 |

OTHER PUBLICATIONS

Japanese Office Action dated Mar. 8, 2016, Application No. 2013-237398, English translation included.

* cited by examiner

PHYSICAL QUANTITY MEASUREMENT SENSOR

The entire disclosure of Japanese Patent Application No. 2013-237398 filed Nov. 15, 2013 is expressly incorporated by reference herein.

TECHNICAL FIELD

The present invention relates to a pressure sensor for measuring fluid pressure and a physical quantity measurement sensor for measuring any other physical quantity of a fluid to be measured.

BACKGROUND ART

There has been known an electronic component device including a ceramic substrate provided with an element such as a crystal oscillator and a sensor element (MEMS) and a metal lid attached to an outer peripheral protrusion of the substrate.

A typical example of the electronic component device includes: a ceramic header; a semiconductor chip fixed to an inside of the ceramic header; a metal cap attached to a wall of the ceramic header to cover the semiconductor chip; and a plurality of lead wires electrically connected to the semiconductor chip and provided to a bottom of the ceramic header (Patent Literature 1: JP-A-9-148499).

In the typical example disclosed in Patent Literature 1, the plurality of lead wires provided to the bottom of the ceramic header extend downward to be attached to a mount board (a mount member).

Another example of the electronic component device includes: a ceramic package; a semiconductor element attached to a cavity of the ceramic package; a lid formed from a metal plate or the like and attached to an upper surface of the ceramic package; an external connection terminal provided to a bottom of the ceramic package; and a resin board such as a printed circuit board attached with the external connection terminal (Patent Literature 2: JP-A-2003-309205).

In the typical example of Patent Literature 2, a corner of the bottom of the ceramic package is soldered to the resin board such as a printed circuit board (a mount member).

Such an electronic component device with a pressure measurement element housed in a ceramic package thereof has been demanded to exhibit a high pressure resistance. Additionally, as a result of improvement in the reliability of attachment of the pressure measurement element to the ceramic package or the like (e.g., bonding using low-melting-point glass and eutectic soldering), a high-pressure measurement has been increasingly demanded.

In order to meet the above demands, it has been considered to provide a fluid introduction passage to the mount member, provide a flow port to the bottom of the ceramic package so that a fluid to be measured fed through the fluid introduction passage flows to the sensor element through the flow port, and attach a periphery of the bottom of the ceramic package to the mount member.

However, in the typical example disclosed in Patent Literature 1, the ceramic header is supported on the mount member through the plurality of lead wires, so that pressure cannot be measured due to a gap between the ceramic header and the mount member. Accordingly, in the typical example disclosed in Patent Literature 1, the ceramic header and the mount member may be fixed to each other using an adhesive or brazed to each other. However, the adhesive itself usually has a low strength and thus a high pressure resistance is unlikely to be achieved. When the ceramic header and the mount member are brazed, a brazing material is likely to be damaged due to a difference in thermal expansion coefficient between the mount member and the ceramic package to cause leakage of the fluid to be measured to the outside.

In the typical example disclosed in Patent Literature 2, the corner of the bottom of the ceramic package is soldered to the mount member, so that the solder is likely to be damaged due to a difference in thermal expansion coefficient between the mount member and the ceramic package in the same manner as when the mount member and the ceramic package are brazed.

When the electronic component device is housed in a recess of the mount member, an opening edge of the recess may be crimped to be engaged with a peripheral protrusion of the ceramic package without using adhesive, brazing material or solder.

However, the ceramic package is likely to be damaged (cracked) depending on a stress applied by crimping. Further, a holding force provided by crimping is likely to be weakened in use due to a difference in thermal expansion coefficient between the mount member and the ceramic package to cause leakage. Moreover, when the holding force is weakened, ground connection to the mount member for stabilizing sensor output cannot be ensured.

SUMMARY OF THE INVENTION

An object of the invention is to provide a physical quantity measurement sensor capable of a high-pressure measurement.

According to a first aspect of the invention, a physical quantity measurement sensor mounted to a mount member provided with a fluid introduction passage includes: a ceramic package including: a plate opposed to the mount member and provided with a flow port through which a fluid to be measured is introduced from the fluid introduction passage; and a wall provided to a periphery of the plate opposed to the mount member; an electronic component housed in the package, the electronic component including a sensing element configured to detect a physical quantity of the fluid to be measured introduced through the flow port; a terminal electrically connected to the electronic component, the terminal being provided on an exterior of the package; a lid attached to the wall; and a metal attachment piece configured to attach the package to the mount member, the attachment piece including: a holding piece configured to hold the package; an engaged piece configured to be engaged with the mount member; and an elastically deformable elastic piece having first and second ends respectively integral with the holding piece and the engaged piece.

In the above aspect, when a fluid to be measured is fed into the physical quantity measurement sensor through the fluid introduction passage of the mount member, the fluid to be measured is fed to the sensing element through the flow port of the package. A signal indicating a physical quantity detected by the sensing element is outputted to the outside through other electronic component(s) and terminal(s). Further, since the metal attachment piece is attached to the mount member by welding, crimping or the like, ground connection to the mount member can be ensured.

In the above aspect, the package is held by the holding piece, so that the package is retained in place irrespective of the flow of a high-pressure fluid to be measured to the bottom of the package. Further, even when the holding piece and the engaged piece are deformed due to a difference in thermal expansion coefficient between the package and the mount member, the deformation is absorbed by the elastic piece.

Therefore, in the aspect of the invention, the attachment piece serves to reliably retain the package in place, so that a high-pressure measurement can be performed.

In the above aspect, it is preferable that the lid be made of metal and include: a lid body configured to cover the electronic component; a lid wall provided integrally with the lid body to be opposed to the wall; and a projecting piece provided integrally with the lid wall, the lid body serve as the holding piece, the lid wall serve as the elastic piece, and the projecting piece serve as the engaged piece.

With the above arrangement, the lid also serves as the attachment piece, so that the number of components can be reduced. As a result, a step for attaching the attachment piece and a step for attaching the lid can be integrated into one step, thereby reducing the number of assembling steps and thus keeping production costs low.

It is preferable that the lid wall include lid walls that are disposed across the lid body, and the projecting piece include projecting pieces that are disposed across the lid body and are each attached to the mount member using a fastener.

With the above arrangement, the sensor can be easily mounted on the mount member using a fastener. This results in simplification of an operation for mounting the physical quantity measurement sensor on the mount member.

It is preferable that the projecting pieces each include: a plate that extends in parallel with a surface of the lid body; and a rib vertically provided to an edge of the plate that extends in parallel with the surface of the lid body, the rib being connected to a corresponding one of the lid walls, and the plate that extends in parallel with the surface of the lid body be provided with a hole for the fastener to be inserted.

With the above arrangement, the attachment piece is provided with the ribs and thus has a three-dimensional structure with a high strength. Therefore, even when the attachment piece of the physical quantity measurement sensor mounted on the mount member is subjected to a large force, the attachment piece can be prevented from being damaged or the like.

It is preferable that the lid be provided with a window in which the terminal is exposed.

With the above arrangement, since the terminal is exposed in the window of the lid, the terminal can be easily connected to an external terminal. This results in simplification of an operation for connecting the physical quantity measurement sensor to the external terminal and thus in simplification of an operation for mounting the physical quantity measurement sensor.

It is preferable that the projecting piece be in a form of a ring that is continuous with an outer periphery of the lid wall and is fixed in a recess provided to the mount member in a crimping manner.

With this arrangement, the structure of the attachment piece can be simplified to keep the production costs of the physical quantity measurement sensor low.

It is preferable that the lid and the package be sealed to each other.

With the above arrangement, the inside of the package can be kept airtight to protect the electronic component therein.

DESCRIPTION OF EMBODIMENT(S)

Exemplary embodiments of the invention will be described below with reference to the attached drawings. In the description of the embodiments, the explanation of common components and of components with the same reference signs will be simplified or omitted.

Figure 1:
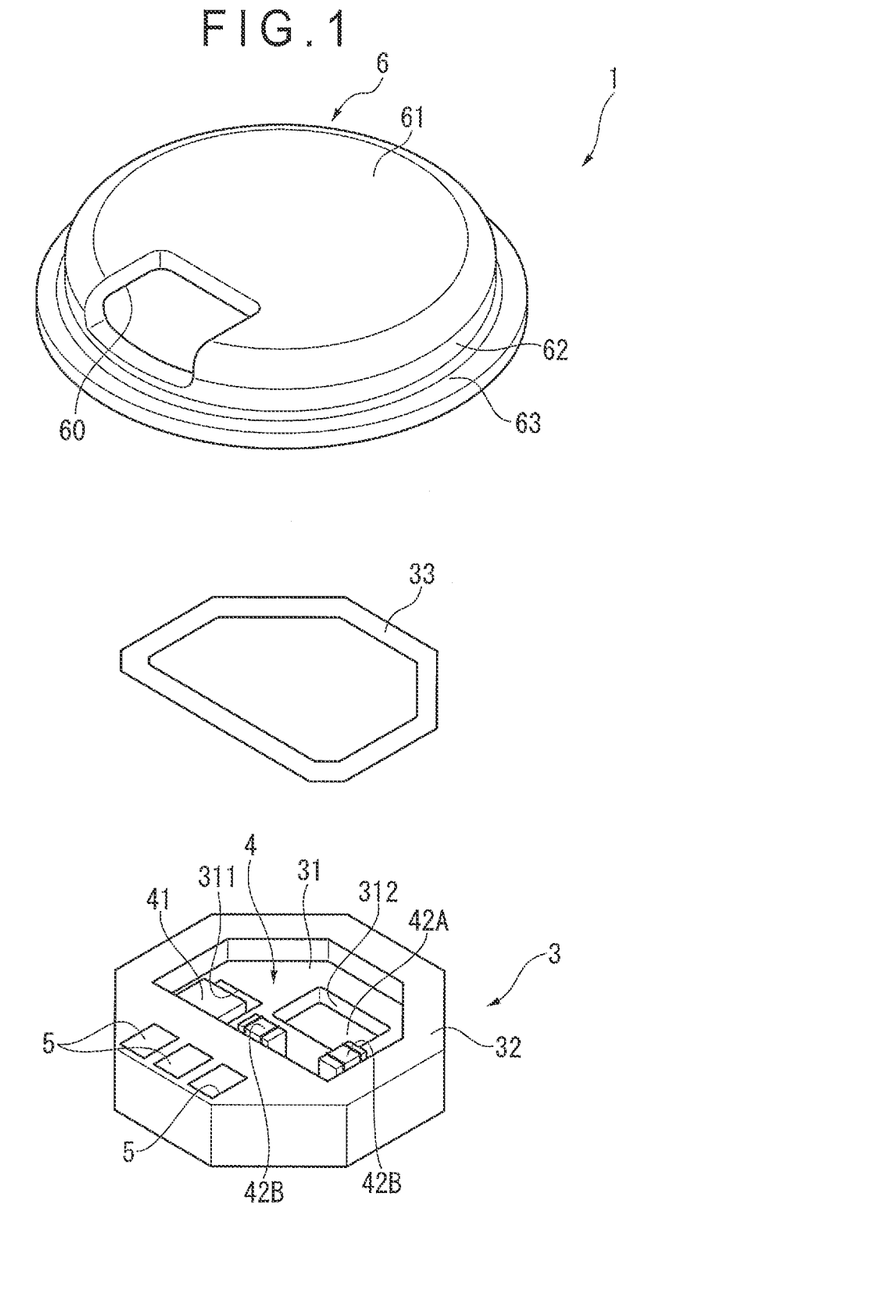
FIG. 1 is an exploded perspective view showing a physical quantity measurement sensor according to a first exemplary embodiment of the invention.

A first exemplary embodiment will be described with reference to FIGS. 1 to 3. FIG. 1 is an exploded perspective view showing a physical quantity measurement sensor according the first exemplary embodiment, and FIGS. 2 and 3 are sectional views each showing the physical quantity measurement sensor mounted on a mount member.

Figure 2:
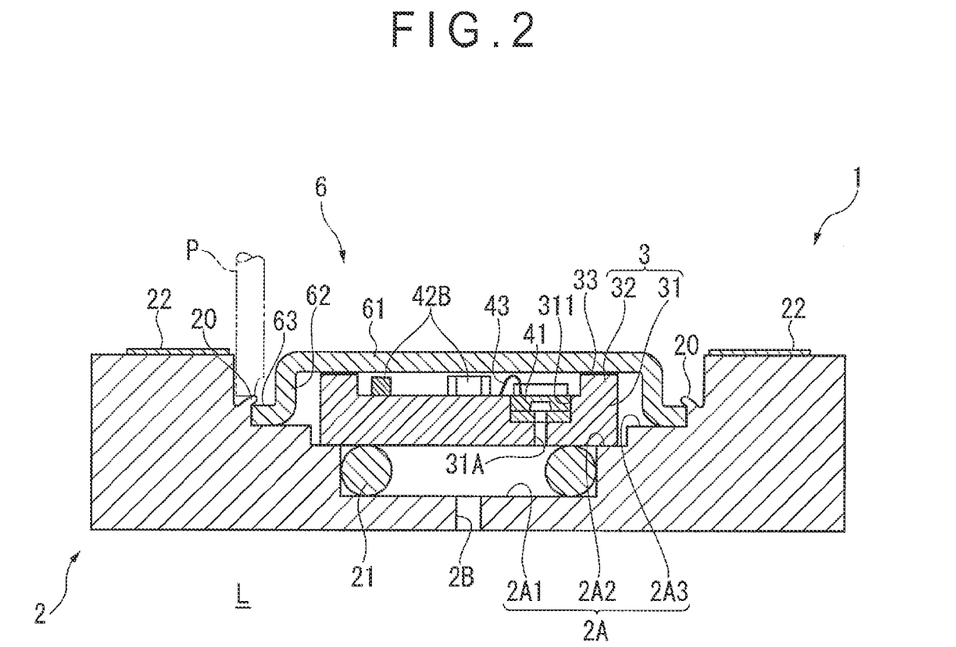
FIG. 2 is a sectional view showing the physical quantity measurement sensor according the first exemplary embodiment mounted on a mount member.
Figure 3:
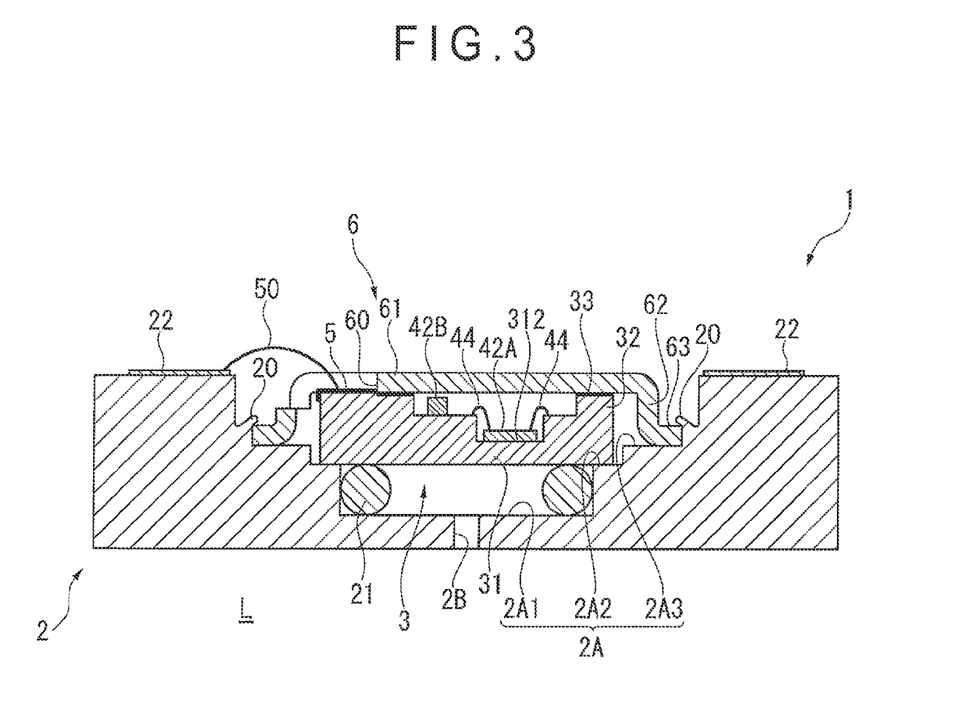
FIG. 3 is a sectional view as observed from a direction different from the direction in FIG. 2, showing the physical quantity measurement sensor according to the first exemplary embodiment mounted on the mount member.

As shown in FIGS. 1 to 3, a physical quantity measurement sensor 1 is a pressure sensor including: a ceramic package 3 disposed to face a mount member 2; an electronic component 4 housed in the package 3; a terminal 5 provided on an exterior of the package 3; and a lid 6 that closes an opening of the package 3. In the first exemplary embodiment, the lid 6 also serves as an attachment piece used to attach the package 3 to the mount member 2.

The mount member 2 is provided with a recess 2A in which the physical quantity measurement sensor 1 is housed. The recess 2A includes continuous small-diameter portion 2A1, medium-diameter portion 2A2 and large-diameter portion 2A3, each of which is in a circular shape in a plan view.

The physical quantity measurement sensor 1 is disposed on a first side of the mount member 2 and a fluid to be measured flows in an area L defined on a second side of the mount member 2 opposite to the first side. In the first exemplary embodiment, the fluid to be measured may be any fluids (e.g., water and oil) or, alternatively, may be air or any other gas.

The mount member 2 is provided with a fluid introduction passage 2B at a predetermined position. The area L and the small-diameter portion 2A1 are thus in communication with each other through the fluid introduction passage 2B so that the fluid to be measured flows into the physical quantity measurement sensor 1.

An O-ring 21 is interposed between a bottom of the small-diameter portion 2A1 and the physical quantity measurement sensor 1 so that the fluid to be measured can be prevented from leaking into the medium-diameter portion 2A2 and the large-diameter portion 2A3 when introduced into the small-diameter portion 2A1.

The package 3 is a laminated substrate including a plurality of laminated ceramic layers of alumina or the like (not shown) and a wiring (not shown) is provided on a surface of the ceramic layers and inside a through hole (not shown) of the ceramic layers.

The package 3 includes: a plate 31 that is in an octagonal shape in a plan view and is opposed to the mount member 2; and a wall 32 provided to all the peripheral sides of the plate 31.

The plate 31 is provided with a flow port 31A into which the fluid to be measured flows after being introduced through the fluid introduction passage 2B. The flow port 31A opens in a first mount 311 provided to the plate 31 at a level lower than that of a surface of the plate 31. A second mount 312 is similarly provided to the plate 31 to be adjacent to the first mount 311. A corner of a bottom of the plate 31 abuts against a surface of the medium-diameter portion 2A2 of the mount member 2.

The wall 32 has a thinned portion corresponding to five of the eight sides of the plate 31 and a thickened portion corresponding to the other three sides of the plate 31. Specifically, an opening edge surrounded by the wall 32 has a hexagonal shape having five sides with the same length and one side longer than the five sides in a plan view.

The electronic component 4 includes: a sensing element 41 housed in the package 3 to detect a pressure of the fluid to be measured having flown through the flow port; an ASIC (Application Specific Integrated Circuit) 42A that performs, for instance, a temperature correction calculation; and a capacitor 42B.

The sensing element 41 includes a bottomed cylindrical MEMS (Micro Electro Mechanical System) including a plate portion having a thinned center and a square tube integrally attached to the plate portion. An opening edge of the square tube of the sensing element 41 is bonded to the first mount 311 of the plate 31 of the package 3 with Au/Su solder, any other eutectic solder, low-melting-point glass or the like.

The plate portion of the sensing element 41 is provided with a sensing unit such as a strain gauge (not shown) that is connected to a pad (not shown) of the plate 31 through a bonding wire 43.

The square tube of the sensing element 41 is in communication with the small-diameter portion 2A1 through the flow port 31A provided through the plate 31.

The ASIC 42A is attached to a surface of the second mount 312. Specifically, an electrically conductive adhesive is applied between the ASIC 42A and the second mount 312 and cured at a high temperature.

The ASIC 42A is connected to a pad (not shown) of the plate 31 through a bonding wire 44. Incidentally, although the figures show that the first mount 311 and the second mount 312 are each in the form of a dent so that the sensing element 41 and the ASIC 42A are respectively mounted therein, the first mount 311 and the second mount 312 may each be in any other form than the recess as long as the sensing element 41 and the ASIC 42A can be respectively mounted therein according to the first exemplary embodiment.

The capacitor 42B is electrically connected to the ASIC 42A and the sensing element 41. The capacitor 42B is soldered or bonded using an electrically conductive adhesive to the plate 31.

The terminal 5 includes three terminals disposed on a surface of the thickened portion of the wall 32 to electrically connect the sensing element 41, the ASIC 42A, the capacitor 42B and other electronic component(s) to an external terminal 22 provided on the mount member 2.

Each of these terminals 5 is in the form of a pad having a rectangular shape in a plan view and has an edge aligned along an edge of the wall 32 (see FIG. 1). Incidentally, in the first exemplary embodiment, the terminals 5 may have any other shape than a rectangular shape in a plan view and the edge of each of the terminals 5 may be spaced from the edge of the wall 32. Further, the number of the terminals 5 may be different from three.

The terminals 5 are connected to the external terminal 22 of the mount member 2 through a connecting member 50. The connecting member 50 may be a bonding wire, a flexible circuit board, an electric wire or the like.

The lid 6 includes: a substantially disc-shaped lid body 61 attached to a surface of the wall 32 to cover the electronic component 4; a lid wall 62 provided to the lid body 61; and a projecting piece 63 provided to the lid wall 62. The lid 6 is provided with a window 60 at a part of the lid body 61 and a part of the lid wall 62 so that the terminals 5 are exposed in the window 60. Incidentally, the lid 6 is integrally formed from Koval, 42 Alloy or any other metal plate material by pressing or the like.

The lid body 61 serves as a holding piece configured to hold the package 3.

The lid body 61 and a top of the wall 32 of the package 3 are air-tightly attached to each other via a sealing ring 33.

The sealing ring 33 is formed in conformity with an opening edge of the package 3 (see FIG. 1). Incidentally, in the first exemplary embodiment, the sealing ring 33 may be replaced by solder, low-melting-point glass or the like to attach the lid body 61 and the package 3 to each other.

The projecting piece 63 serves as an engaged piece engageable with the mount member 2. The projecting piece 63 is in the form of a ring continuously provided to an outer periphery of the lid wall 62 and is fixed to the large-diameter portion 2A3 of the mount member 2 in a crimping manner. Specifically, an outer periphery of the projecting piece 63 is held between a crimped portion 20 provided to the large-diameter portion 2A3 and a surface of the large-diameter portion 2A3.

The lid wall 62, which has first and second ends respectively integral with the lid body 61 and the projecting piece 63, serves as an elastically deformable elastic piece and is opposed to an outer circumferential surface of the wall 32 of the package 3. A predetermined gap is defined between an inner circumferential surface of the lid wall 62 and the outer circumferential surface of the wall 32 of the package 3.

In order to provide the above arrangement according to the first exemplary embodiment, the sensing element 41, the ASIC 42A and the capacitor 42B are first mounted on the plate 31 of the package 3. Subsequently, the lid body 61 of the lid 6 is attached to the wall 32 of the package 3. The terminals 5 provided on the surface of the wall 32 of the package 3 are thus exposed in the window 60 of the lid 6. The thus-assembled physical quantity measurement sensor 1 is then subjected to calibration.

After being calibrated, the physical quantity measurement sensor 1 is to be mounted on the mount member 2. Specifically, the O-ring 21 is set in the small-diameter portion 2A1 of the mount member 2, and then the physical quantity measurement sensor 1 is set on the mount member 2 with a bottom of the package 3 being applied as an O-ring-sealing surface. Simultaneously, the plate 31 of the package 3 abuts against the surface of the medium-diameter portion 2A2 of the mount member 2. When the plate 31 abuts against the surface of the medium-diameter portion 2A2, the projecting piece 63 of the lid 6 abuts against a bottom of the large-diameter portion 2A3 over a predetermined length from an outer peripheral edge of the projecting piece 63. The crimped portion 20 is then pressed using a punch P to fix the projecting piece 63 to the large-diameter portion 2A3 in a crimping manner.

Subsequently, the terminals 5 and the external terminal 22 provided on the mount member 2 are connected to each other through the connecting member 50.

When the physical quantity measurement sensor 1 is thus mounted on the mount member 2, the fluid to be measured flows into the physical quantity measurement sensor 1 from the area L through the fluid introduction passage 2B of the mount member 2 and the small-diameter portion 2A1.

The fluid to be measured is then fed to the sensing element 41 through the flow port 31A of the package 3 to deform the plate portion of the sensing element 41. In response to the deformation of the plate portion of the sensing element 41, the sensing unit sends a signal to the ASIC 42A, the capacitor 42B and other electronic component(s) through the bonding wire 43. After being amplified and adjusted by the ASIC 42A, the signal is outputted to the outside from the terminals 5 through the connecting member 50 and the external terminal 22.

The first exemplary embodiment as described above provides, for instance, the following advantageous effects (1) to (6).

(1) The physical quantity measurement sensor 1 includes: the ceramic package 3 including the plate 31 provided with the flow port 31A; the electronic component 4 including the sensing element 41, the sensing element 41 being housed in the package 3 to detect the pressure of the fluid to be measured having flown through the flow port 31A; the terminals 5 provided on the exterior of the package 3; the lid 6 attached to the wall 32 of the package 3; and the metal attachment piece used to attach the package 3 to the mount member 2. While holding the package 3, the attachment piece is engaged with the mount member 2. Therefore, the package 3 can be retained in place without being detached from the mount member 2 even when the fluid to be measured, which may have a high pressure, flows to the bottom of the package 3. Further, the attachment piece has an elastic middle portion that can absorb a relative deformation of both ends of the attachment piece due to a difference in thermal expansion coefficient between the package 3 and the mount member 2. Therefore, the physical quantity measurement sensor 1 can measure the pressure of the fluid to be measured irrespective of whether or not the pressure is high.

(2) The lid 6 includes: the lid body 61 that covers the electronic component 4 and holds the package 3; the projecting piece 63 engageable with the mount member 2; and the elastically deformable lid wall 62 provided integrally with the lid body 61 and the projecting piece 63 to be opposed to the wall 32. The lid 6 thus also serves as the attachment piece, so that the number of components can be reduced. Further, the lid 6, which is made of metal, is attached to the mount member 2 by welding, crimping or the like, thereby ensuring ground connection to the mount member 2.

The projecting piece 63 is in the form of a ring continuously provided to the outer periphery of the lid wall 62 and is fixed in the recess 2A of the mount member 2 in a crimping manner, so that the structure of the attachment piece can be simplified and thus the production costs of the physical quantity measurement sensor 1 can be kept low.

(4) Since the lid 6 is provided with the window 60 in which the terminals 5 are exposed, the terminals 5 can be easily connected to the external terminal 22 provided on the mount member 2. This results in simplification of an operation for mounting the physical quantity measurement sensor 1 on the mount member 2.

(5) The lid body 61 and the wall 32 of the package 3 are sealed to each other via the sealing ring 33, so that the inside of the package 3 can be kept airtight to protect the electronic component 4 and the like housed therein.

(6) The mount member 2 is provided with the recess 2A including the small-diameter portion 2A1 that is in communication with the fluid introduction passage 2B and the medium-diameter portion 2A2 that is continuous with the small-diameter portion 2A1, and the package 3 abuts against the bottom of the medium-diameter portion 2A2 with the O-ring 21 being interposed between the bottom of the small-diameter portion 2A1 and the package 3. Therefore, the fluid to be measured introduced into the small-diameter portion 2A1 is prevented from leaking outside through the medium-diameter portion 2A2. This results in prevention of deterioration of the measurement accuracy of the physical quantity measurement sensor 1.

Next, a second exemplary embodiment of the invention will be described with reference to FIGS. 4 and 5.

The second exemplary embodiment is the same as the first exemplary embodiment except the arrangement of a lid.

Figure 4:
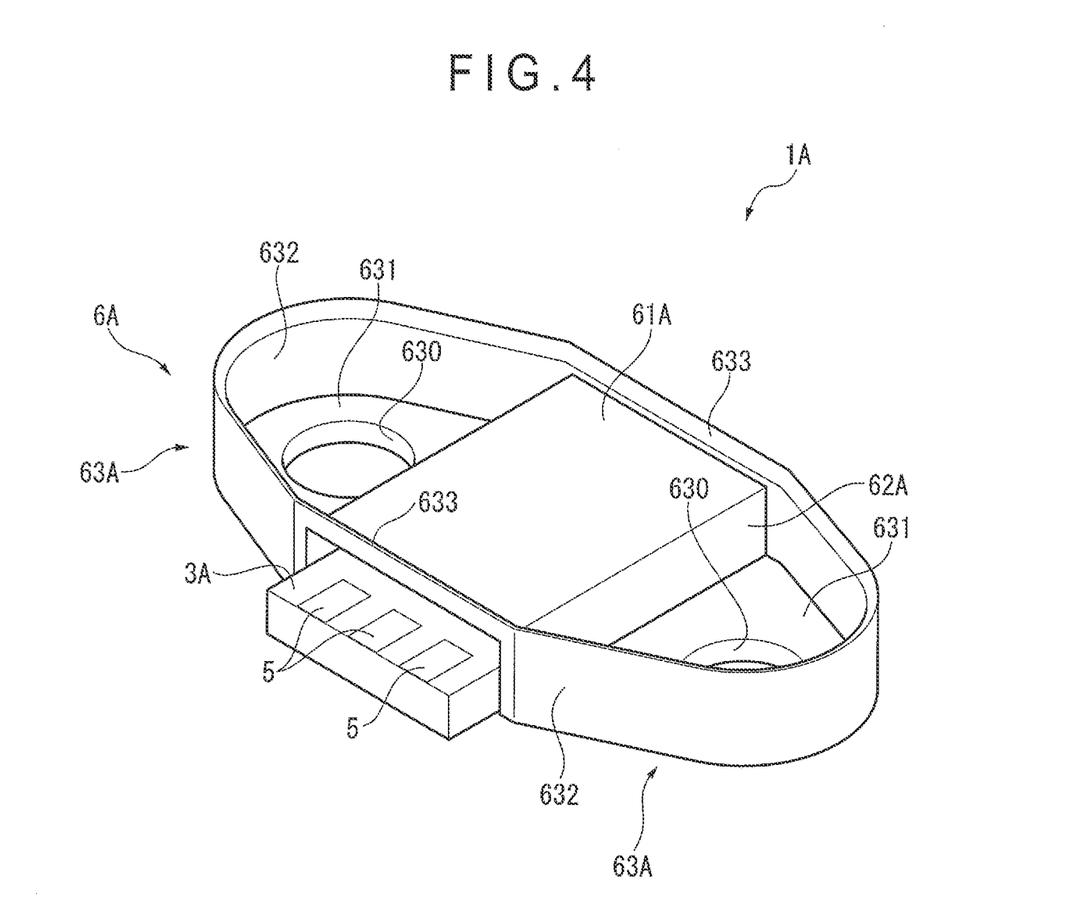
FIG. 4 is a perspective view showing a physical quantity measurement sensor according to a second exemplary embodiment of the invention.
Figure 5:
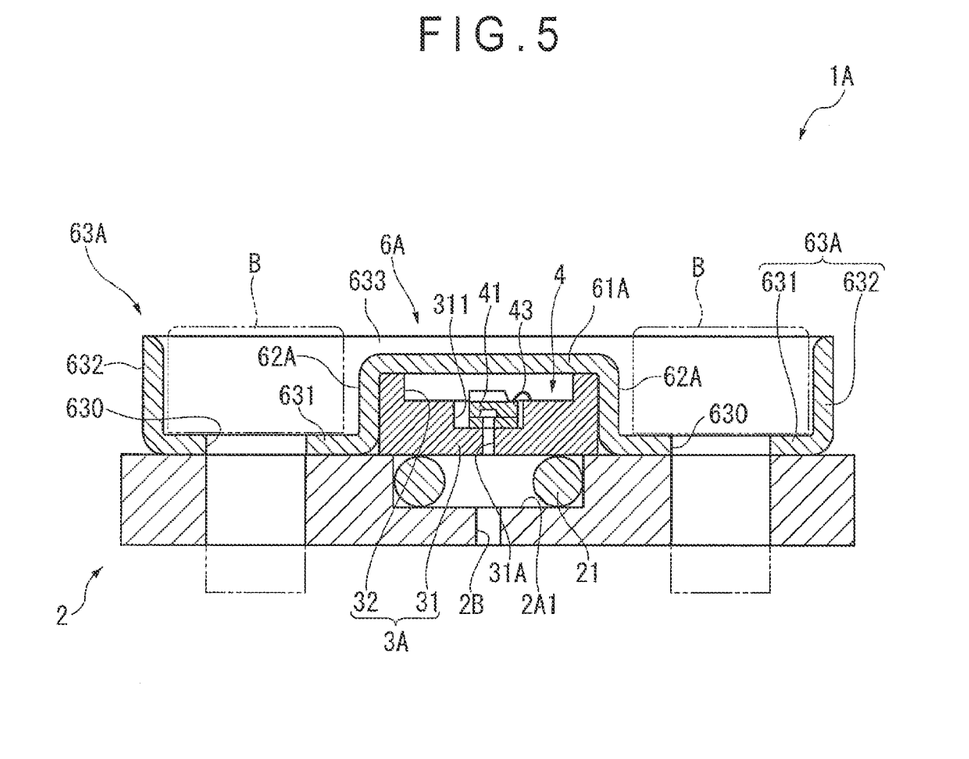
FIG. 5 is a sectional view showing the physical quantity measurement sensor according the second exemplary embodiment mounted on a mount member.

FIG. 4 is a perspective view showing an overall arrangement of a physical quantity measurement sensor 1A according the second exemplary embodiment, and FIG. 5 is a sectional view showing the physical quantity measurement sensor 1A mounted on the mount member 2.

As shown in FIGS. 4 and 5, the physical quantity measurement sensor 1A is a pressure sensor including: a ceramic package 3A; the electronic component 4 housed in the package 3A; the terminal 5 provided to the package 3A; and a metal lid 6A that closes an opening of the package 3A, as in the first exemplary embodiment.

In the second exemplary embodiment, the lid 6A also serves as the attachment piece used to attach the package 3A to the mount member 2 in the same manner as in the first exemplary embodiment. Incidentally, in the second exemplary embodiment, the mount member 2 includes the small-diameter portion 2A1 and the fluid introduction passage 2B, but a medium-diameter portion and a large-diameter portion as provided in the first exemplary embodiment are omitted.

The package 3A has the same arrangement as that of the package 3 of the first exemplary embodiment except that the package 3A has a rectangular front shape. Incidentally, the ASIC 42A, the capacitor 42B, the bonding wire 44 and the like are not shown in FIG. 5.

The lid 6A includes: a lid body 61A that is substantially in a rectangular shape in a plan view and covers the electronic component 4; lid walls 62A provided to opposite sides of the lid body 61A; and a projecting piece 63A provided to each of the lid walls 62.

The projecting pieces 63A serve as the engaged piece engageable with mount member 2.

The lid body 61A is interposed between the lid walls 62A and between the projecting pieces 63A.

The lid walls 62A are provided to two of the sides of the lid body 61A where the projecting pieces 63A are provided. No lid wall 62A is provided to the other two of the sides of the lid body 61A. The package 3A is housed in a space defined by the lid body 61A and the lid walls 62A.

The projecting pieces 63A each include: a plate 631 that is substantially in a triangular shape in a plan view and extends in parallel with a surface of the lid body 61A; and a rib 632 vertically provided to an edge of the plate 631.

The ribs 632 are thus disposed to face each other across the lid body 61A and ribs 633 are integrally provided between the ribs 632. The ribs 633 are vertically provided to a periphery of the lid body 61A. Incidentally, in the second exemplary embodiment, the plates 631 may each have any other shape in a plan view than a substantially triangular shape, such as semicircle and rectangle.

The plates 631 each have one side integrated with the lid wall 62A and the other two sides integrated with the rib 632.

The projecting pieces 63A are each attached to the mount member 2 using a fastener B. The plates 631 are each provided with a hole 630 through which the fastener B is inserted. Various types of fasteners such as a bolt are usable as the fastener B.

The second exemplary embodiment can provide the following advantageous effects (7) and (8) in addition to the advantageous effects (1), (2), (5) and (6) of the first exemplary embodiment.

(7) The lid body 61A is interposed between the lid walls 62A and between the projecting pieces 63A and the projecting pieces 63A are each attached to the mount member 2 using the fastener B. The physical quantity measurement sensor 1A can thus be easily and reliably mounted on the mount member 2.

(8) The projecting pieces 63A each include the plate 631 and the rib 632 vertically provided to the edge of the plate 631 and the plate 631 is attached to the mount member 2 using the fastener B. The projecting pieces 63A thus have a three-dimensional shape with a high strength. This results in preventing the physical quantity measurement sensor 1A from being detached from the mount member 2.

Next, a third exemplary embodiment of the invention will be described with reference to FIG. 6.

The third exemplary embodiment is the same as the first exemplary embodiment except the arrangement of a lid different from those of the first and second exemplary embodiments.

Figure 6:
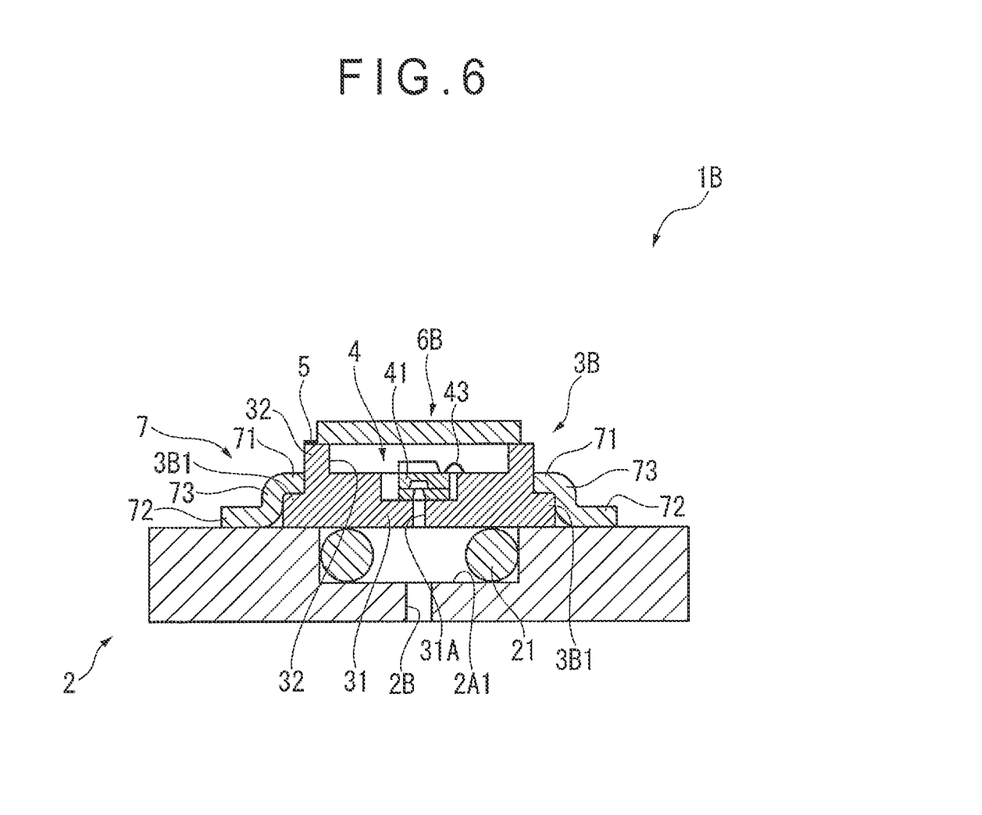
FIG. 6 is a sectional view showing the physical quantity measurement sensor according a third exemplary embodiment of the invention mounted on a mount member.

FIG. 6 is a sectional view showing a physical quantity measurement sensor according the third exemplary embodiment mounted on a mount member.

As shown in FIG. 6, a physical quantity measurement sensor 1B is a pressure sensor including: a ceramic package 3B; the electronic component 4 housed in the package 3B; the terminal 5 provided to a top of the package 3B; a metal lid 6B that closes an opening of the package 3B; and an attachment piece 7 used to attach the package 3B to the mount member 2.

The third exemplary embodiment is different from the first and second exemplary embodiments in that the package 3B is attached to the mount member 2 using not the lid 6B but the attachment piece 7 independent of the lid 6B. Incidentally, in the third exemplary embodiment, the mount member 2 includes the small-diameter portion 2A1 and the fluid introduction passage 2B, but a medium-diameter portion and a large-diameter portion as provided in the first exemplary embodiment are omitted as in the second exemplary embodiment.

The package 3B has the same arrangement as that of the package 3A of the second exemplary embodiment except a step 3B1 provided along each of the four outer peripheral sides of the package 3B.

The lid 6B, which covers the electronic component 4, is a flat metal plate substantially in a rectangular shape in a plan view and slightly smaller than an outer contour of the wall 32. The terminal 5 is thus exposed from an edge of the lid 6B. The flat plate used as the lid 6B has the same arrangement as that of a lid usable for a typical package and is attached to the top of the package 3B.

The attachment piece 7 includes four attachment pieces disposed across the package 3B. The attachment pieces 7 each include: a holding piece 71 that holds the step 3B1 of the package 3B; an engaged piece 72 engageable with the mount member 2; and an elastic piece 73 connected to the holding piece 71 and the engaged piece 72.

The holding piece 71 is configured to hold a surface of the step 3B1 and has an end abutting against the package 3B.

The engaged piece 72 is fixed to a surface of the mount member 2 using, for instance, a bolt or solder (not shown).

The elastic piece 73 is elastically deformable between the holding piece 71 and the engaged piece 72.

The holding piece 71, the engaged piece 72 and the elastic piece 73 are integrally formed from an elastic metal plate by pressing or any other process.

The third exemplary embodiment can provide the following advantageous effect (9) in addition to the advantageous effects (1), (5) and (6) of the first exemplary embodiment.

(9) Since the attachment piece 7 is provided independently of the lid 6B, a typical lid is usable as the lid 6B. Therefore, the lid 6B can be sealed to the package 3B in a typical method, so that an operation for sealing can be facilitated.

It should be appreciated that the invention is not limited to the above-described exemplary embodiments, but includes modifications and improvements as long as such modifications and improvements are compatible with the invention.

For instance, in the first exemplary embodiment shown in FIGS. 1 to 3, although the projecting piece 63 continuously provided to the outer periphery of the lid wall 62 is fixed in the recess 2A of the mount member 2 in a crimping manner, the projecting piece 63 may be fixed in the recess 2A in a different manner. For instance, the projecting piece 63 may be fixed using a fastener (e.g., a bolt) as in the second exemplary embodiment or, alternatively, may be fixed by, for instance, a metal-flow method or welding.

In the third exemplary embodiment shown in FIG. 6, although the attachment pieces 7 are disposed at four positions across the package 3B, the attachment pieces 7 may be disposed at two positions across the package 3B or, alternatively, one attachment piece 7 may be sufficient as long as the attachment piece 7 is modified to be in an annular shape.

In the third exemplary embodiment, although the step 3B1 is provided to an outer surface of the package 3B so that the package 3B is held by the holding piece 71, the outer surface of the package 3B may be flattened without the step 3B1. In this case, the holding piece 71 may hold the top of the package 3B. Alternatively, the holding piece 71 may hold a part (an outer periphery) of the top of the package 3B or, alternatively, hold the entire top. When the holding piece 71 holds the outer periphery of the top of the package 3B, the lid 6B may be attached to an inner periphery of the top of the package 3B. When the holding piece 71 holds the entire top of the package 3B, the holding piece 71 may be extended toward the center of the package 3B in a plan view to serve as a lid.

In the second exemplary embodiment shown in FIGS. 4 and 5, although the terminal 5 is provided to the package 3A at an outside relative to the rib 633 in the package 3A, the terminal 5 may be covered by the lid body 61A as long as the lid body 61A is provided with a window in which the terminal 5 is exposed. Similarly, in the third exemplary embodiment, although the lid 6B is slightly smaller than the outer contour of the wall 32 so that the terminal 5 is exposed from the edge of the lid 6B, the lid 6B may be sized to cover at least the entire top of the wall 32 as long as the lid 6B is provided with a window in which the terminal 5 is exposed.

In the first to third exemplary embodiments, although the lid 6 (6A, 6B) is sealed to the package 3 (3A, 3B) the lid 6 (6A, 6B) may be partially opened so that the inside of the package 3 (3A, 3B) is in communication with the outside without departing the scope of the invention. In the third exemplary embodiment, although the lid 6B is made of metal, the lid may be made of any other material than metal, such as a synthetic resin, without departing the scope of the invention. When the lid is made of a synthetic resin, the lid may be attached to the package 3B using an adhesive or the like.

In the first to third exemplary embodiments, although the physical quantity measurement sensor is exemplified by a pressure sensor, the invention is applicable to any other sensor such as a differential pressure sensor and a temperature sensor.

The invention claimed is:

1. A physical quantity measurement sensor mounted to a mount member provided with a fluid introduction passage, the physical quantity measurement sensor comprising:
    a ceramic package comprising:
        a plate opposed to the mount member and provided with a flow port through which a fluid to be measured is introduced from the fluid introduction passage; and
        a wall provided to a periphery of the plate opposed to the mount member to define a recess;
    an electronic component housed in the recess of the package, the electronic component comprising a sensing element configured to detect a physical quantity of the fluid to be measured introduced through the flow port;
    a terminal electrically connected to the electronic component, the terminal being provided on an exterior of the wall of the package;
    a lid attached to the wall, the lid comprising a window in which the terminal is exposed to outside of the ceramic package; and
    a metal attachment piece configured to attach the package to the mount member, the attachment piece comprising:
        a holding piece configured to hold the package to cover the electronic component;
        an engaged piece configured to be engaged with the mount member; and
        an elastically deformable elastic piece having first and second ends respectively integral with the holding piece and the engaged piece.

2. The physical quantity measurement sensor according to claim 1, wherein
    the lid is made of metal and comprises:
        a lid body configured to cover the electronic component;
        a lid wall provided integrally with the lid body to be opposed to the wall; and
        a projecting piece provided integrally with the lid wall,
    the lid body serves as the holding piece,
    the lid wall serves as the elastic piece, and
    the projecting piece serves as the engaged piece.

3. The physical quantity measurement sensor according to claim 2, wherein
    the lid wall comprises lid walls that are disposed across the lid body, and
    the projecting piece comprises projecting pieces that are disposed across the lid body and are each attached to the mount member using a fastener.

4. The physical quantity measurement sensor according to claim 3, wherein
    the projecting pieces each comprise:
        a plate that extends in parallel with a surface of the lid body; and
        a rib vertically provided to an edge of the plate that extends in parallel with the surface of the lid body, the rib being connected to a corresponding one of the lid walls, and
    the plate that extends in parallel with the surface of the lid body is provided with a hole for the fastener to be inserted.

5. The physical quantity measurement sensor according to claim 2, wherein the projecting piece is in a form of a ring that is continuous with an outer periphery of the lid wall and is fixed in a recess provided to the mount member in a crimping manner.

6. The physical quantity measurement sensor according to claim 1, wherein the projecting piece is in a form of a ring that is continuous with an outer periphery of the lid wall and is fixed in a recess provided to the mount member in a crimping manner.

7. The physical quantity measurement sensor according to claim 1, wherein the lid and the package are sealed to each other.

8. The physical quantity measurement sensor according to claim 1, wherein the lid is attached to the wall of the ceramic package by solder or low-melting-point glass.

* * * * *

UNITED STATES PATENT AND TRADEMARK OFFICE
CERTIFICATE OF CORRECTION

| | |
|---|---|
| PATENT NO. | : 9,352,958 B2 |
| APPLICATION NO. | : 14/540632 |
| DATED | : May 31, 2016 |
| INVENTOR(S) | : Atsushi Imai et al. |

It is certified that error appears in the above-identified patent and that said Letters Patent is hereby corrected as shown below:

TITLE PAGE

FOREIGN PATENT DOCUMENTS
Change "2001-24032" to --2001-242032--.

Signed and Sealed this
Ninth Day of August, 2016

Michelle K. Lee
*Director of the United States Patent and Trademark Office*